(12) United States Patent
Shrader et al.

(10) Patent No.: US 8,551,556 B2
(45) Date of Patent: Oct. 8, 2013

(54) METHOD FOR OBTAINING CONTROLLED SIDEWALL PROFILE IN PRINT-PATTERNED STRUCTURES

(75) Inventors: Eric Shrader, Belmont, CA (US); Uma Srinivasan, Mountain View, CA (US); Clark Crawford, Danville, CA (US); Scott Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1095 days.

(21) Appl. No.: 11/943,453

(22) Filed: Nov. 20, 2007
(Under 37 CFR 1.47)

(65) Prior Publication Data

US 2009/0130298 A1      May 21, 2009

(51) Int. Cl.
*B05D 5/12*     (2006.01)
*B05D 5/06*     (2006.01)
*B05D 5/00*     (2006.01)

(52) U.S. Cl.
USPC ............................ 427/58; 427/256; 427/64

(58) Field of Classification Search
USPC ................... 427/58, 256, 265, 282; 347/20
See application file for complete search history.

(56) References Cited

U.S. PATENT DOCUMENTS

| | | | |
|---|---|---|---|
| 3,958,252 A | 5/1976 | Kashio | |
| 4,131,899 A | 12/1978 | Christou | |
| 4,533,624 A | 8/1985 | Sheppard | |
| 4,959,674 A | 9/1990 | Khri-Yakub et al. | |
| 5,681,445 A * | 10/1997 | Harrison et al. | 205/445 |
| 5,958,122 A | 9/1999 | Fukuda et al. | |
| 6,116,718 A | 9/2000 | Peeters et al. | |
| 6,306,933 B1 | 10/2001 | Eiger et al. | |
| 6,468,702 B1 | 10/2002 | Yi et al. | |
| 6,742,884 B2 | 6/2004 | Wong et al. | |
| 6,759,713 B2 | 7/2004 | Chabinyc et al. | |
| 6,838,361 B2 | 1/2005 | Takeo | |

(Continued)

FOREIGN PATENT DOCUMENTS

| | | |
|---|---|---|
| EP | 08169504 | 10/2009 |
| GB | 2350321 | 11/2000 |
| JP | 2005-059199 | 3/2005 |

OTHER PUBLICATIONS

Koch et al., "Influence of water on the work function of conducting poly (3,4-ethylenedioxythiophene)/poly (styrenesulfonate)", Appl. Phys. Let. 90, 043512 (2007).

(Continued)

*Primary Examiner* — Michael Cleveland
*Assistant Examiner* — Austin Murata
(74) *Attorney, Agent, or Firm* — Jonathan A. Small

(57) ABSTRACT

High aspect ratio structures can be obtained by print-patterning masking features in feature stacks such that each feature has a lateral edge which is aligned in a plane roughly perpendicular to the plane of the substrate on which the features are formed. Due to the differential lateral spreading between features formed on a substrate and formed atop other features, the print head is indexed less than the radius of a droplet to a position where a droplet ejected by the print head forms an upper feature atop a lower feature such that the lateral edges of the upper and lower features are aligned in the plane roughly perpendicular to the plane of the substrate. Feature stacks of two or more features may provide a vertical (or re-entrant) sidewall mask for formation of high aspect ratio structures, by e.g., electroplating, etc.

23 Claims, 10 Drawing Sheets

(56) References Cited

U.S. PATENT DOCUMENTS

| | | |
|---|---|---|
| 6,872,320 B2 * | 3/2005 | Wong et al. ............... 216/13 |
| 6,872,588 B2 | 3/2005 | Chabinyc et al. |
| 6,890,050 B2 | 5/2005 | Ready et al. |
| 6,972,261 B2 | 12/2005 | Wong et al. |
| 2002/0097356 A1 | 7/2002 | Kawase et al. |
| 2003/0049865 A1 * | 3/2003 | Santini et al. ............ 436/518 |
| 2003/0197754 A1 | 10/2003 | Nakamura |
| 2004/0110099 A1 | 6/2004 | Kozawa et al. |
| 2004/0253835 A1 | 12/2004 | Kawase |
| 2005/0122351 A1 * | 6/2005 | Yamazaki et al. ........... 347/5 |
| 2005/0136358 A1 * | 6/2005 | Paul et al. ............... 430/311 |
| 2005/0255392 A1 | 11/2005 | Tsai et al. |
| 2006/0226478 A1 * | 10/2006 | Brar et al. ............... 257/341 |
| 2006/0246711 A1 * | 11/2006 | Lehr et al. ............... 438/622 |
| 2007/0172774 A1 | 7/2007 | Limb |
| 2007/0216724 A1 * | 9/2007 | Shibata et al. ............ 347/41 |
| 2008/0150989 A1 * | 6/2008 | Srinivasan et al. .......... 347/14 |

OTHER PUBLICATIONS

European Search Report, EP 07100905, dated Mar. 27, 2008 (7 pages).

* cited by examiner

METHOD FOR OBTAINING CONTROLLED SIDEWALL PROFILE IN PRINT-PATTERNED STRUCTURES

BACKGROUND OF THE INVENTION

1. Field of the Invention

The present invention is generally related to methods of forming a mask for controlling material deposition, and more particularly to methods of forming a print-patterned mask for plating and the like having high aspect ratio mask structures with controlled side-wall profiles.

2. Description of the Prior Art

Digital inkjet lithography is a maturing technology designed to reduce the costs associated with photolithographic processes, used often in the fabrication of microelectronic devices, integrated circuits, and related structures. Digital lithography directly deposits material in desired patterns onto a substrate, taking the place of the delicate and time-consuming photolithography processes used in conventional device manufacturing. One application of digital lithography is the formation of a mask (referred to herein as a "print-patterned mask") for subsequent processing (e.g., plating, etching, implanting, etc.)

Typically, digital lithography involves depositing a print material by moving a print head and a substrate relative to one another along a primary axis (the "print travel axis"). Print heads, and in particular, the arrangements of the ejectors incorporated in those print heads, are optimized for printing along this print travel axis. Printing takes place in a raster fashion, with the print head making "printing passes" across the substrate as the ejector(s) in the print head dispense individual "droplets" of print material onto the substrate or other previously deposited material. Typically, the print head moves relative to the substrate in each printing pass, but the equivalent result may be obtained if the substrate is caused to move relative to the print head (for example, with the substrate secured to a moving stage) in a printing pass. At the end of each printing pass, the print head (or substrate) makes a perpendicular shift relative to the print travel axis before beginning a new printing pass. Printing passes continue in this manner until the desired pattern has been fully printed onto the substrate.

Materials typically printed by digital lithographic systems include phase change material and solutions of polymers, colloidal suspensions, such suspensions of materials with desired electronic properties in a solvent or carrier. For example, U.S. Pat. Nos. 6,742,884 and 6,872,320 (each incorporated herein by reference) teach a system and process, respectively, for printing a phase change material onto a substrate for masking. According to these references, a suitable material, such as a stearyl erucamide wax, is maintained in liquid phase over an ink-jet style piezoelectric print head, and selectively ejected on a droplet-by-droplet basis such that droplets of the wax are deposited in desired locations in a desired pattern on a layer formed over a substrate. The droplets exit the print head in liquid form, then solidify after impacting the layer, hence the material is referred to as a phase-change material.

Once dispensed from an ejector, a print material droplet attaches itself to the surface through a wetting action as it solidifies in place. In the case of printing phase-change materials, solidification occurs when a heated and liquefied printed droplet loses its thermal energy to the substrate and/or environment and reverts to a solid form. In the case of suspensions, after wetting to the substrate, the carrier most often either evaporates leaving the suspended material on the substrate surface or the carrier hardens or cures. The thermal conditions and physical properties of the print material and substrate, along with the ambient conditions and nature of the print material, determine the specific rate at which the deposited print material transforms from a liquid to a solid, and hence the height and profile of the solidified deposited material.

If two adjacent droplets are applied to the substrate within a time prior to the solidification of either or both droplets, the droplets may wet and coalesce together to form a single, continuous printed feature. Surface tension of the droplet material, temperature of the droplet at ejection, ambient temperature, and substrate temperature are key attributes for controlling the extent of droplet coalescence and lateral spreading of the coalesced material on the substrate surface. These attributes may be selected such that a desired feature size may be obtained.

It is known to print droplets one atop another in order to build up the height of a structure above the substrate. This is particularly relevant when printing a mask, such as for plating, deposition of a color pixel filter, etc., where a high aspect ratio structure is desired or required. However, we have discovered that when printing one droplet atop another there is a tendency for the first droplet printed directly onto the substrate to spread out laterally upon printing. When a second droplet is printed onto the first, the extent of the lateral spreading of the second droplet is less than that of the first. This is illustrated in FIG. 12, in which a substrate 10 has a plurality of printed features 12a, b deposited directly thereon, and a plurality of features 14a, b printed atop of features 12a, b. Each feature 12a, b is initially deposited onto substrate 10 by a print head 18. Following the ejection of a droplet forming feature 12a in a first position (a), print head 18 advances in the print travel direction (PT) to a second location (b) and deposits a next droplet to form feature 12b. This process may be repeated such that with print head 18 in position (a), feature 14a is formed over feature 12a, print head 18 advanced in the print travel direction to location (b), and feature 14b then deposited over feature 12b, and so on.

Print head 18 ejects droplets 20 in a direction indicated by arrow P towards substrate 10. Typically, direction P is roughly perpendicular to the plane of the top surface 22 of substrate 10. Droplets generally form symmetrical features when deposited, each feature having a centerline $C_a$, $C_b$, etc., representing effectively a line of symmetry through the feature. Due to the stepped nature of the print head movement, centerlines of features formed from droplets deposited at position (a) tend to be collinearly aligned, centerlines of features formed from droplets deposited at position (b) tend to be collinearly aligned, and so forth.

As can be seen from FIG. 12, the lateral width (parallel to the plane of surface 22) of features 12a, 12b exceed the lateral width of features 14a, 14b. This is true even though the volume of droplet material, the temperature of the droplets at ejection from print head 18, the rate of droplet ejection, and other details for features 14a, 14b were the same as for the deposition of features 12a, 12b. However, the centerlines of the stacked features tend to remain collinear, as shown in FIG. 12.

The observed difference in lateral width of the deposited droplets leads to the consequence that the sides of the built-up layers of features taper away from a line perpendicular to the plane of surface 22. This is illustrated by the lines $S_1$ and $S_2$, representing the angle of the sidewalls of the built up feature stacks 12a/14a, and 12b/14b, respectively. It is noted that since the centerlines of the feature stacks are roughly perpendicular to the plane of surface 22, the plane of the sidewalls of those feature stacks are each are inclined (e.g., by angles α, β, respectively) with reference to the respective centerlines $C_a$, $C_b$.

It is desirable when forming a mask structure, for example a plating mask, that the sidewalls of the mask features be nearly perpendicular to the surface of the substrate on which they are formed. For example, the bus connections and metal contacts over silicon or other photosensitive material for a solar cell extend over virtually the entire collection surface area for maximum capture and conduction of electrons produced by photovoltaic effects. However, the total area covered by the collection electrodes should be minimized so that they block as little light as possible from reaching the p/n junction layer of the solar cell. That is, increasing the ratio of unmasked surface to masked surface increases the conversion and efficiency of the cell. For this reason, there is a desire to form these electrodes as narrow as possible, on the order of 50 to 100 microns (micrometers), and provide sufficient conductivity by forming them to be relatively tall (that is, they are formed to have a high aspect ratio). Thus, bearing the above description of prior art digital lithographic mask formation in mind, when forming a mask for plating a structure there is a need to optimize the sidewall angle of feature stacks with reference to a plane which is perpendicular to the substrate surface.

SUMMARY OF THE INVENTION

The present invention is directed to a system and method for providing print-patterned mask structures with sidewall planes more nearly perpendicular to the plane of the substrate. According to one aspect of the invention, a digital lithographic process is configured to provide print-patterned mask features in at least two layers, with one layer printed directly atop another layer to form a feature stack, such that one feature is offset from an underlying feature in order to selectively align the plane of the sidewall of that feature stack.

According to another aspect of the present invention, a digital lithographic print head ejects from a first position a droplet such that it impacts a substrate, hardens, and forms a first mask feature. In the process of hardening, the droplet wets to the substrate surface and spreads. When hardened, this first feature has a lateral edge, roughly circumferential when viewed in the direction of droplet ejection. Sidewall plane alignment in a feature stack is accomplished by advancing the digital lithographic print head to a second position such that the ejected droplet at the second position forms a second feature atop the first feature, the second feature having a lateral edge approximately aligned with the lateral edge of the first feature. It will be appreciated that in this aspect of the present invention, the centerlines of the first and second feature are not collinear (although they may be parallel). Typically, the lateral edges will be aligned where a gap in the mask is desired (e.g., where material is to be deposited in subsequent steps).

In yet another aspect of the present invention, the above process may be repeated for a third and subsequent layers. The print head is returned to the second position (or need not be shifted therefrom) to obtain third (and subsequent) features in the feature stack with a lateral edge aligned to that of the first and second features. The second, third, and so forth features have similar lateral spreading when solidifying. In this aspect of the invention, the centerlines of the second, third, and so on, features will be coaxial (but not coaxial with the centerline of the first feature). In general, the features will be formed so as to provide a relatively linear sidewall profile lying in a plane which is roughly perpendicular to the plane of the surface of the substrate over which the features are formed. The features can also have a slightly re-entrant profile.

Following formation of the mask, further process may be performed. For example, material may be deposited onto the substrate in regions exposed by the mask (and prevented from being deposited elsewhere by the mask). One example of such a deposition is the electroplating of copper in order to form a pattern of conductive interconnections on the substrate. However, a mask formed by the method disclosed herein may be used with many other deposition processes and materials, and indeed for purposes other than deposition, such as exposure masking, etc. as will be appreciated by one of ordinary skill in the art to which the present invention relates. According to one aspect of the invention, the material deposited onto the substrate in regions exposed by the mask may make electrical contact with those regions of the substrate (or components formed in or on the substrate). Accordingly, alignment of the regions exposed by the mask to regions of the substrate permit formation of electrical contacts to components in or on the substrate.

The above is a summary of a number of exemplary unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE INVENTION

Figure 1:
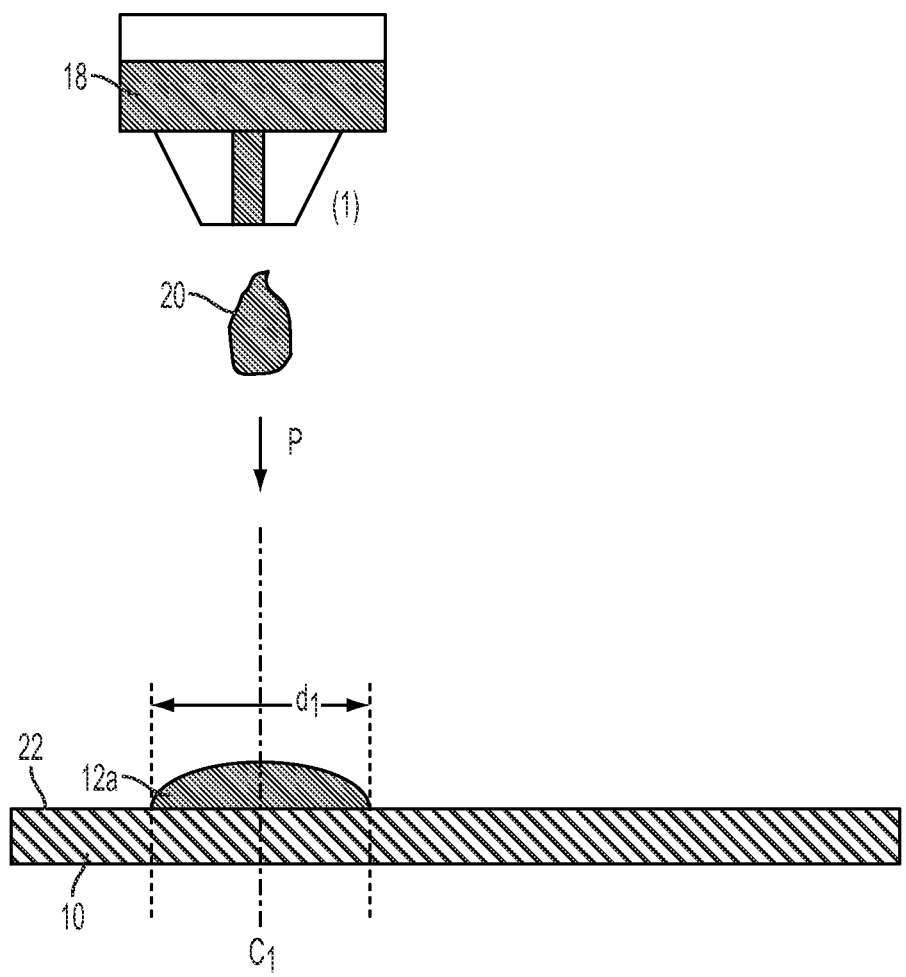
FIG. 1 is an illustration of the preliminary steps in a process of producing a print-patterned mask structures with sidewall planes roughly perpendicular to the plane of the substrate according to one embodiment of the present invention.

With reference now to FIG. 1, there is shown therein the preliminary steps in the process of producing a print-patterned mask structure with sidewall planes roughly perpendicular to the plane of the substrate. The process begins with the positioning of print head 18 over a selected location of substrate 10 such that a droplet of feature material may be directed toward surface 22 over substrate 10. Substrate 10 may have formed thereon or therein layers of material within which electronic, optical, optoelectronic, electromechanical, and other components are formed. Therefore, layer 22 may be a surface of substrate 10 or a surface of a layer formed over substrate 10.

Print head 18 may be a piezoelectric inkjet-type print head for ejecting on a droplet-by-droplet basis a masking material, for example as described in the aforementioned U.S. Pat. Nos. 6,742,884 and 6,872,320. The material ejected by print head 18 may be a phase change material, material suspended in a solvent or carrier, or other appropriate masking material. For purposes of illustration we focus here on phase change materials, but it will be understood that the present invention is not limited to such material. One example of a phase change material which may be employed by the present invention is the aforementioned stearyl erucamide wax. The material is typically solid at room temperature, so it is first heated to its liquid phase.

With print head 18 in a first position (1), a droplet 20 of phase-change material is ejected in liquid form therefrom in a direction P roughly perpendicular to the plane of surface 22. Upon impact with surface 22, droplet 20 will typically spread in diameter in the plane of surface 22 in the process of cooling, and ultimately solidify as a generally circular (plan view) feature 12a having a diameter $d_1$. Due to its symmetry, feature 12a will have a centerline $C_1$.

Figure 2:
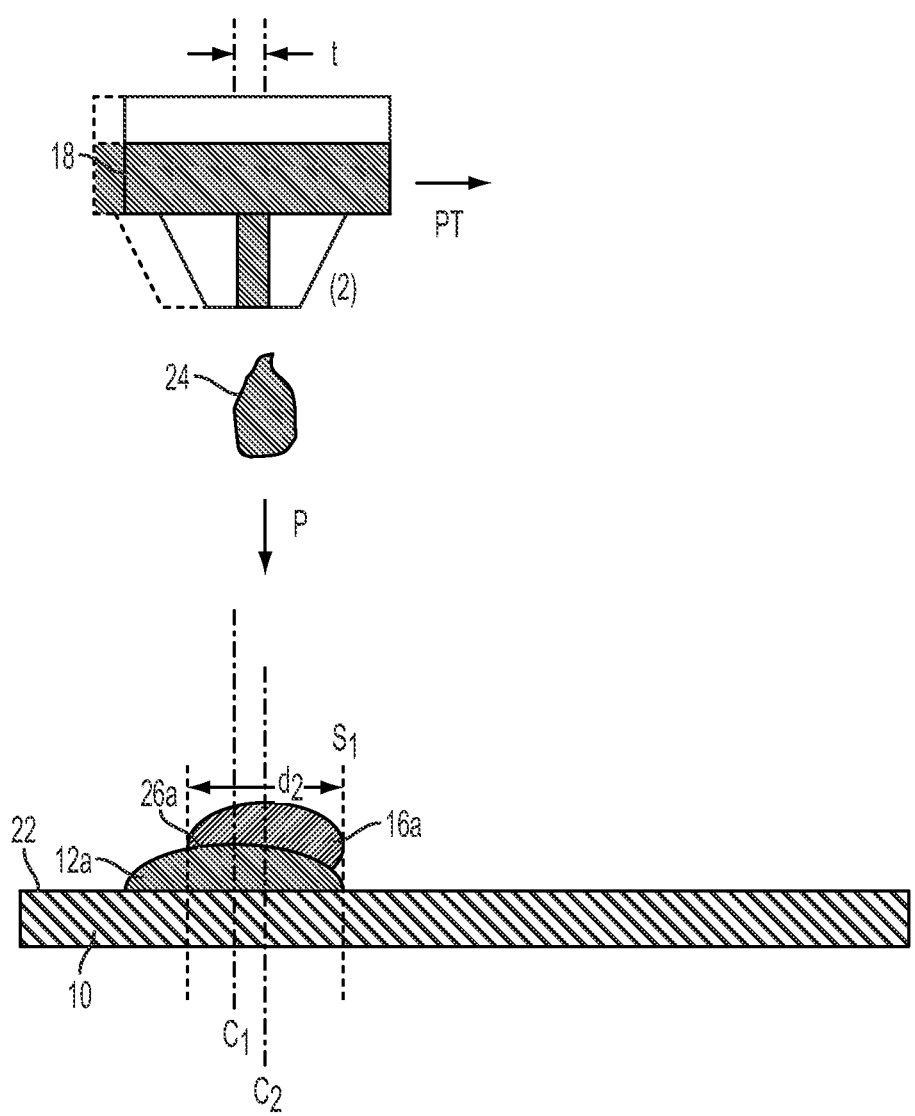
FIG. 2 is an illustration of a subsequent step in the process of producing a print-patterned mask structures with sidewall planes roughly perpendicular to the plane of the substrate illustrated in FIG. 1.

As illustrated in FIG. 2, at this stage print head 18 may be advanced in the print travel direction by an amount t, described further below, from the first position (1) to a second position (2). A second droplet 24 may then be ejected by print head 18. However, droplet 24 will impact the upper surface 26 of the previously formed feature 12a. Due largely to the difference in wetting properties between surfaces 22 and 26, this second droplet will spread by a lesser amount than the spreading exhibited by droplet 20. Upon cooling and solidification, this forms feature 16a atop feature 12a, with feature 16a having a diameter $d_2$ such that $d_1 > d_2$. Feature 16a will also have a generally circular plan view, with a centerline $C_2$. A feature stack comprised of features 12a and 16a is thereby produced.

It is a goal of the present invention to enable the production of a feature stack with a sidewall roughly perpendicular to surface 22 (e.g., a vertical sidewall). Therefore, the distance t by which print head 18 advances is controlled such that the lateral edges of features 12a and 16a are aligned along a plane perpendicular to the plane of surface 22. More particularly, distance t may be found from $$t = (d_1 - d_2)/2$$

The diameters $d_1$ and $d_2$ may be determined prior to formation of the mask using a control process. One example for the values of these feature diameters is $d_1$ at about 60μ (micrometers) and $d_2$ at about 40μ. Thus, for this example, in order to obtain lateral edge alignment and a feature stack having a sidewall plane roughly perpendicular to the plane of the substrate, $$t = (60\mu - 40\mu)/2 = 10\mu$$

A typical high quality inkjet type printer prints at around 600 dots-per-inch (dpi), providing a minimum advancement in the print travel direction of at least 10μ. Thus, the degree of print head position control required to realize the present invention is within the capability of present day print devices.

Figure 3:
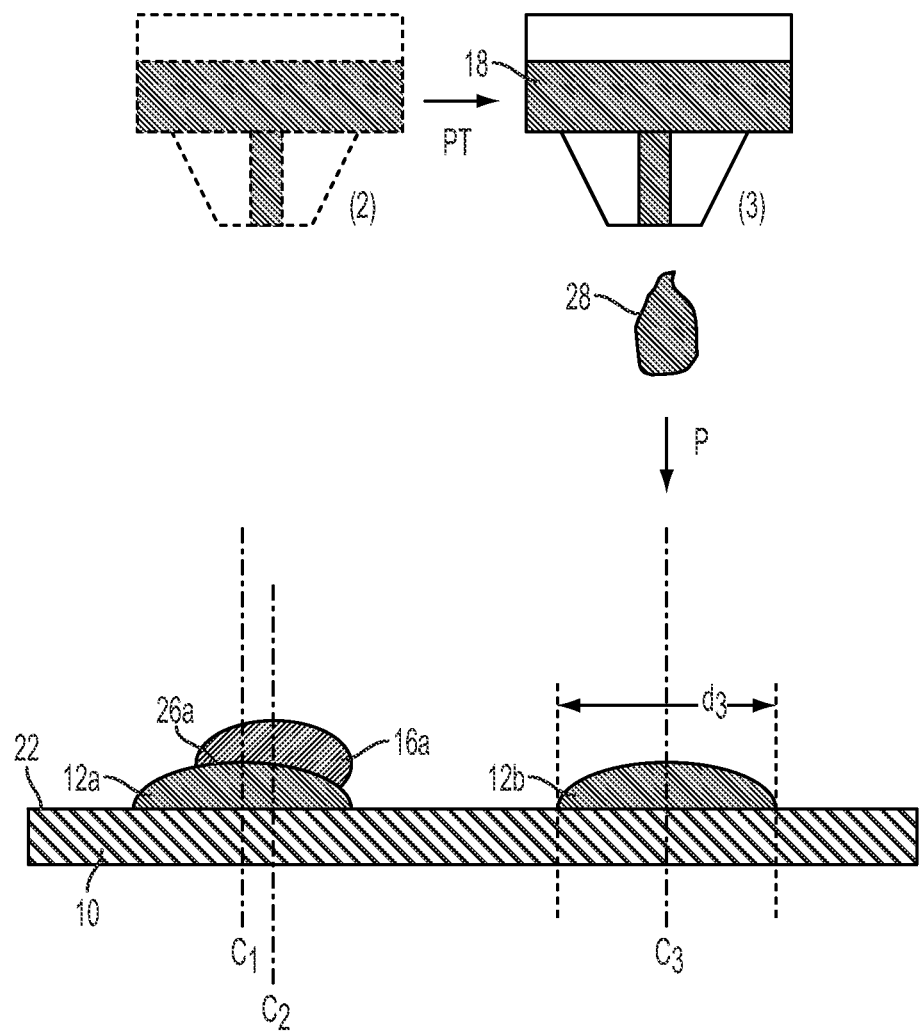
FIG. 3 is an illustration of another step in the process of producing a print-patterned mask structures with sidewall planes roughly perpendicular to the plane of the substrate illustrated in FIG. 1.

With print stack 12a/16a positioned as desired, print head 18 may be advanced to the next position in the print travel direction at which a feature is to be formed. As illustrated in FIG. 3, this may be position (3), at which a droplet 28 is ejected from print head 18 in order to form feature 12b. Again, upon impact with surface 22, droplet 28 will spread in diameter in the plane of surface 22 in the process of cooling, and ultimately solidify as generally circular (plan view) feature 12b having a diameter $d_3$. Due to its symmetry, feature 12b will have a centerline $C_3$.

Figure 4:
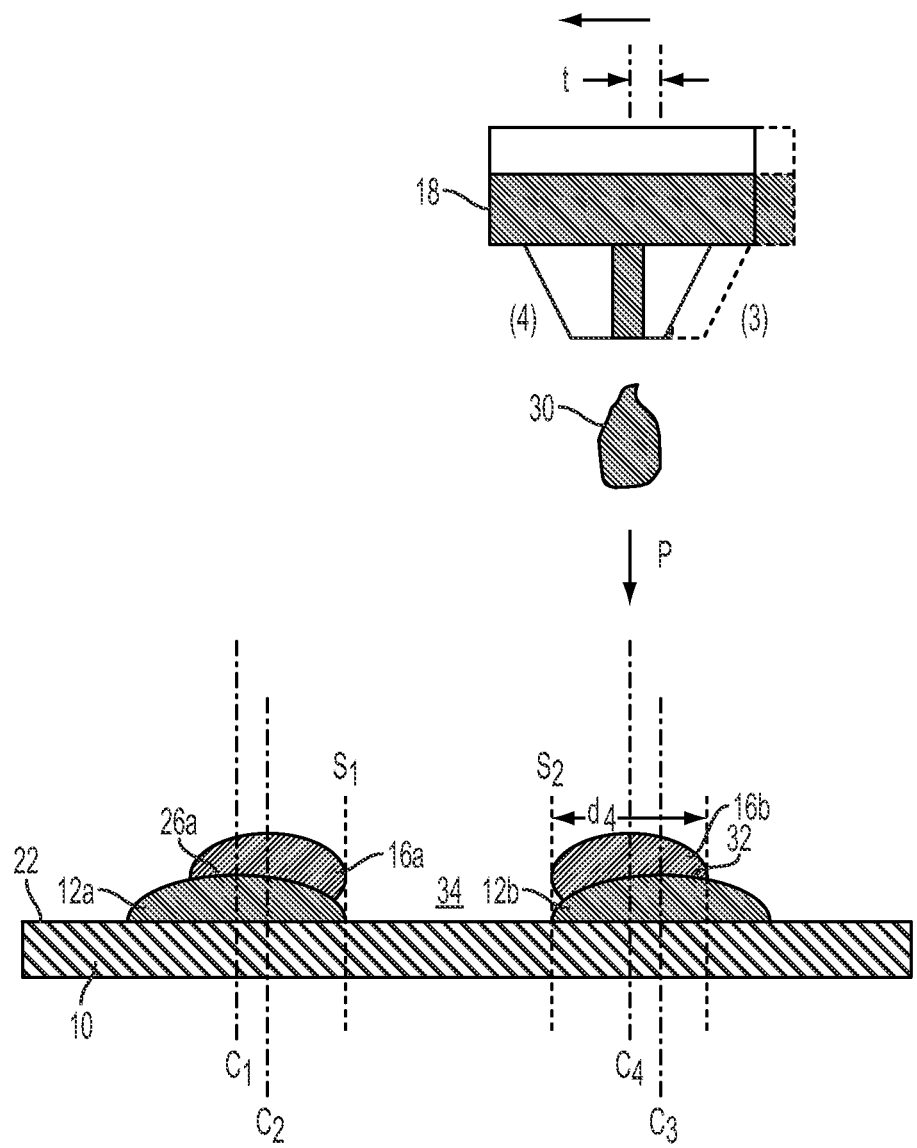
FIG. 4 is an illustration of yet another step in the process of producing a print-patterned mask structures with sidewall planes roughly perpendicular to the plane of the substrate illustrated in FIG. 1.

As illustrated in FIG. 4, at this stage print head 18 may be reversed in the print travel direction by an amount t to position (4). Another droplet 30 may then be ejected by print head 18. However, droplet 30 will impact the upper surface 32 of the previously formed feature 12b. Droplet 30 will spread by a lesser amount than the spreading exhibited by droplet 28. Upon cooling and solidification, this forms feature 16b atop feature 12b, with feature 16b having a diameter $d_4$ such that $d_3 > d_4$. Feature 16b will also have a generally symmetrical, circular plan view, with a centerline $C_4$. A feature stack comprised of features 12b and 16b is thereby produced. As the droplet printing process is well understood and closely controllable, feature sizes will be fairly uniform as between features 12a, 12b, etc. as well as between feature 16a, 16b, etc. Thus, print head 18 is reversed by distance t to again obtain aligned lateral edges of features 12b and 16b. (Alternatively, to avoid having to reverse print head travel direction, an entire first layer of features 12a, 12b, etc. may be printed, then a second pass made thereover, printing atop features 12a, 12b, etc. with offsets of a distance t from $C_1$, $C_3$, etc. prior to indexing to the next print line.)

At this point, it will be appreciated that feature stacks 12a/16a and 12b/16b form sidewalls $S_1$ and $S_2$, respectively, each with a plane roughly perpendicular to the plane of surface 22. Thus, a region 34 has been formed within which material may be deposited such that its sidewalls will be in planes substantially perpendicular to the plane of surface 22. Furthermore, this structure is illustrated as only a single feature deep. However, as print head 18 completes a row of features or feature stacks, it may index to a next row where it may deposit features or feature stacks in the manner previously described so as to produce a complete mask structure on substrate 10.

Figure 5:
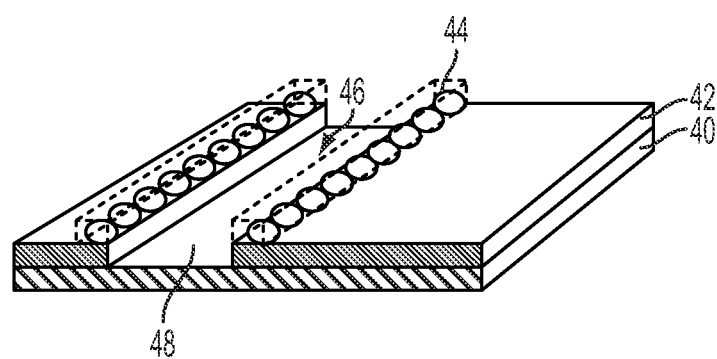
FIG. 5 is an illustration of a portion of a final print-patterned mask structure produced according to an embodiment of the present invention.

FIG. 5 is a plan-view of a portion of a substrate 40 having a layer 42 of first features print-patterned thereon. In this embodiment, individual features forming layer 42 have at least partially coalesced into a relatively large (as compared to the individual feature size) region of masking material covering substrate 40. Therefore, individual first features 12a, 12b, etc. are not specifically illustrated. In a region where no features were deposited, a channel 46 is formed. In channel 46, the surface 48 of substrate 40 (or alternatively a layer formed on substrate 40) is exposed. It is in channel 46 that material may be subsequently deposited such that it contacts surface 48. The depth of channel 46 is increased by the addition of a second layer 44 of print patterned features. These are shown in FIG. 5 as individual features, but similar to layer 42, they may coalesce into a more homogenous structure as part of the disposition process. According to the above description, second layer 44 is formed such that its lateral edge aligns with the lateral edge of layer 42 adjacent channel 46, thereby providing a sidewall in a plane roughly perpendicular to the plane of surface 48. The increased depth of channel 46 provided by second layer 44 provides for the formation of taller structures in channel 46.

Figure 6:
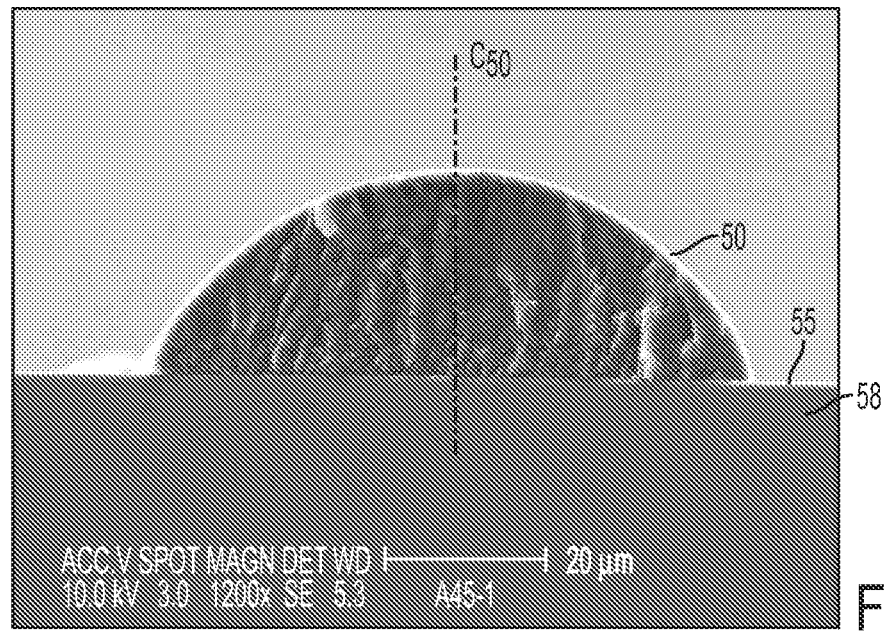
FIG. 6 is a cross-sectional scanning electron micrograph (SEM) of a first printed feature produced by an inkjet style print head.
Figure 7:
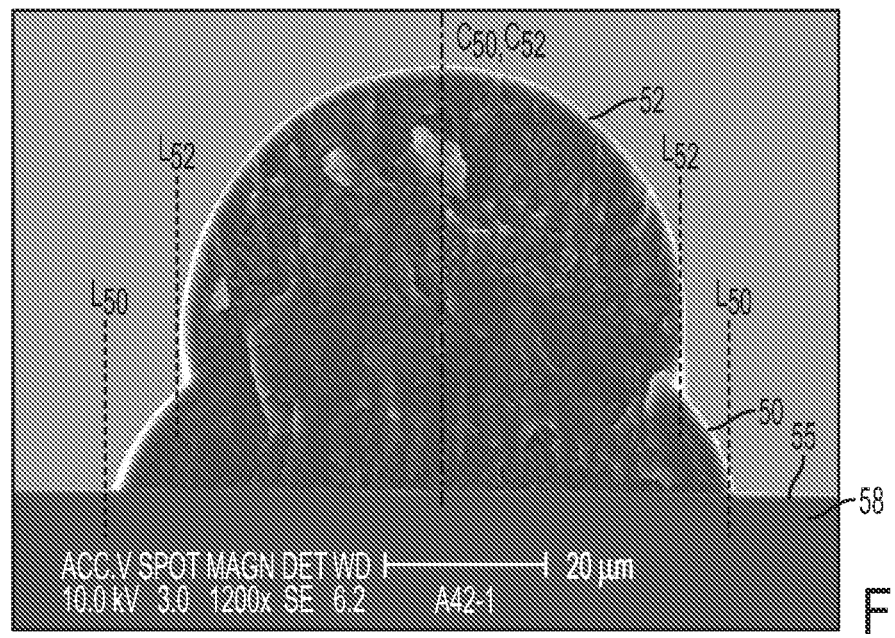
FIG. 7 is a cross-sectional SEM of a second feature printed such that the centerlines of the first and second features are coaxial.

With reference to FIG. 6, there is shown a cross-sectional scanning electron micrograph (SEM) of a first printed feature 50 comprised of stearyl erucamide wax produced by an inkjet style print head as described above. With reference to FIG. 7, there is shown therein a cross-sectional SEM of a second feature 52 printed of the same stearyl erucamide wax and under the same printing conditions as feature 50, printed such that the centerlines of features 50 and 52 ($C_{50}$, $C_{52}$) are coaxial. That is, feature 52 was printed after feature 50 but from the same print head position as was used to print feature 50. It can be seen that the lateral edges $L_{50}$ of feature 50 extend out farther than the lateral edges $L_{52}$ of feature 52, as previously described.

Figure 8:
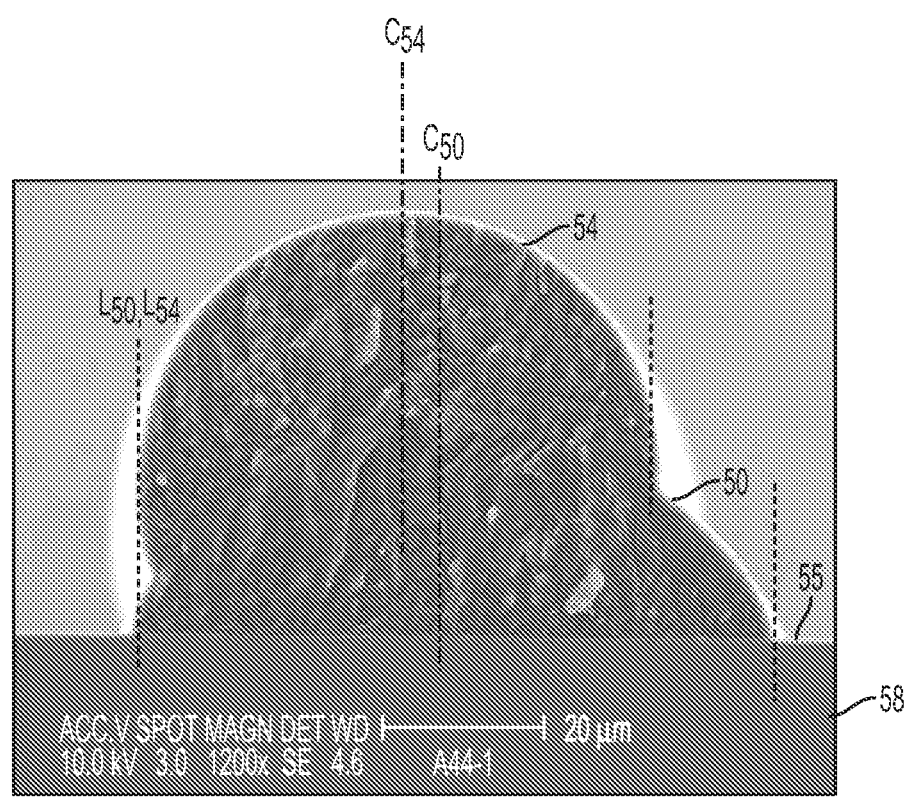
FIG. 8 is a cross-sectional SEM of a third feature printed such that the centerlines of features 50 and 54 are offset from one another by a distance t approximately equal to 10μ

With reference to FIG. 8, there is shown therein a cross-sectional SEM of another feature stack, this time comprised of feature 50 and feature 54 printed of the same stearyl erucamide wax and under the same printing conditions as feature 50, but in this example, feature 54 is printed such that the centerlines of features 50 and 54 ($C_{50}$, $C_{54}$) are offset from one another by a distance t approximately equal to 10μ. That is, feature 54 was printed after feature 50 but with the print head position shifted 10μ in the print travel direction from the position in which feature 50 was printed. It can be seen that a lateral edge $L_{50}$ of feature 50 is in line with a lateral edge $L_{54}$ for feature 54, in a plane roughly perpendicular to the plane of surface 56 of substrate 58, as previously described. This alignment of lateral edges presents an improved mask sidewall for producing structures such as gridlines for solar cells and the like with sidewalls roughly perpendicular to the plane of the substrate. Tall, narrow (high aspect ratio) structures may thereby be produced.

Figure 9A:
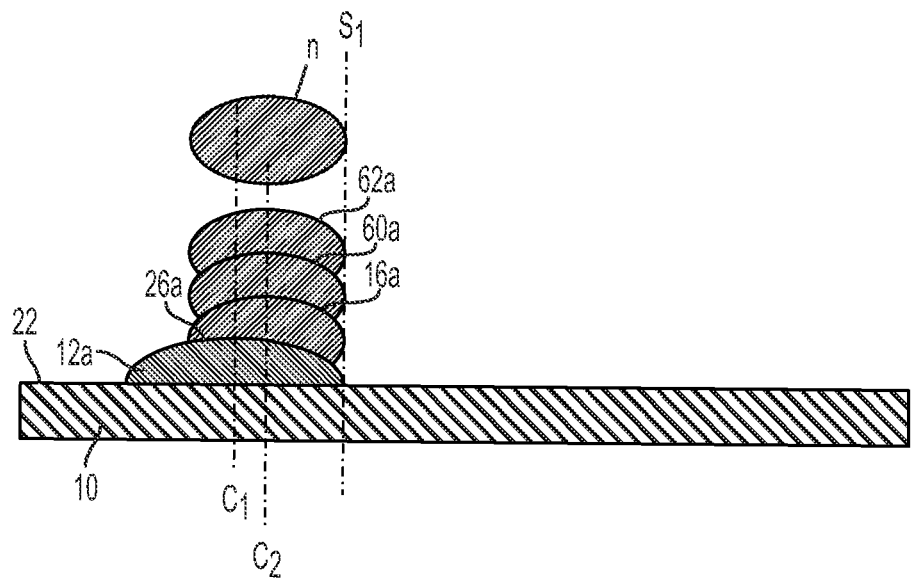
FIG. 9A is an illustration of a print-patterned mask structure having more than two layers of features in order to provide a mask for greater aspect ratio structures.

While the description to this point has focused on two layers of features (feature stacks 12a/16a and 12b/16b), it is contemplated that more than two layers of features may be formed in order to provide a mask for increased aspect ratio structures. Such a mask is shown in FIG. 9A. It will be understood that just as the difference in wetting between surfaces 22 and 26a leads to a lateral spread of second feature 16a which is less than that of the first feature 12a, a droplet forming third feature 60a which is deposited on the surface of feature 16a will exhibit a lateral spreading closer to that forming feature 16a than feature 12a. Indeed, if print head 18 is registered to the same position it was in when depositing feature 16a, then the centerline $C_2$ of feature 16a will also be the centerline for feature 60a. Furthermore, the lateral edge of feature 60a will align with the lateral edges of features 12a and 16a at sidewall $S_1$. Finally, all of the above holds true for additional features formed in the stack, such as feature 62a, etc.

Figure 9B:
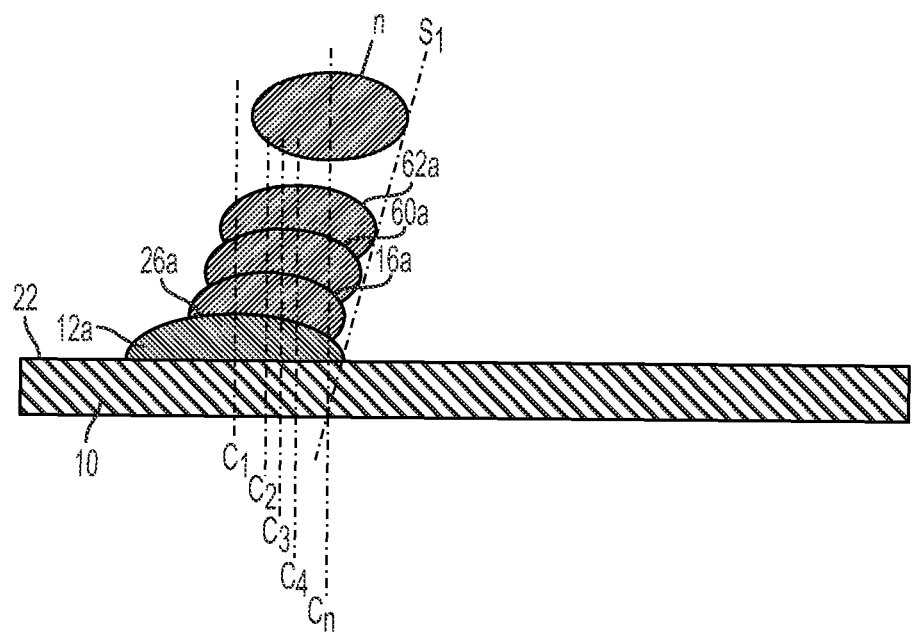
FIG. 9B is an illustration of a print-patterned mask structure having more than two layers of features with a slightly re-entrant profile.

FIG. 9B illustrates a variation of the base embodiment of a mask for forming structures with increased aspect ratio. In FIG. 9B, the centerline $C_3$ of feature 60a is shifted relative to centerline $C_2$, and centerline $C_4$ is shifted relative to centerline $C_3$. This is accomplished by incrementally advancing print head 18 after depositing feature 16a, then again after depositing feature 60a and so on. This produces a reentrant sidewall $S_1$, that is, one inclined relative to a plane that is perpendicular to surface 22. This permits the manufacture of complete masking structures having reentrant sidewalls, and ultimately structures as described further below with inclined sidewalls.

Figure 10:
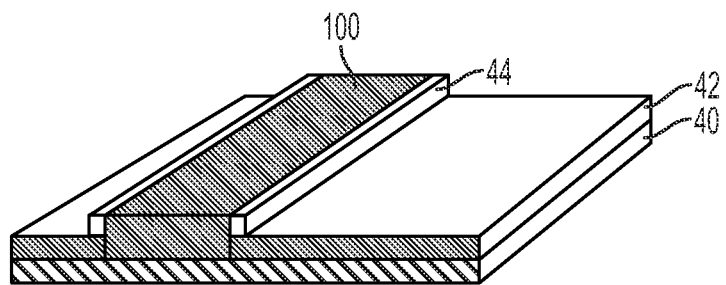
FIG. 10 is an illustration of a structure following deposition of a conductive material and removal of the print-patterned mask according to an embodiment of the present invention.
Figure 11:
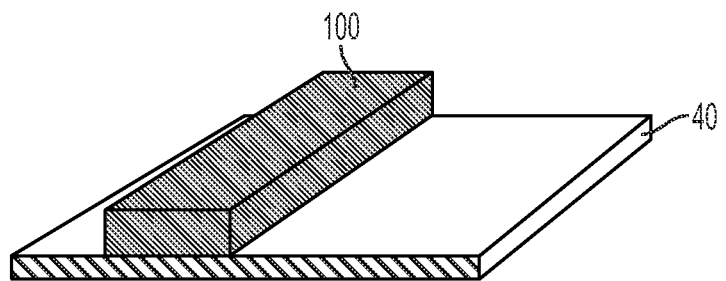
FIG. 11 is a cross-section of a print patterned mask structure manufactured according to known techniques.
Figure 12:
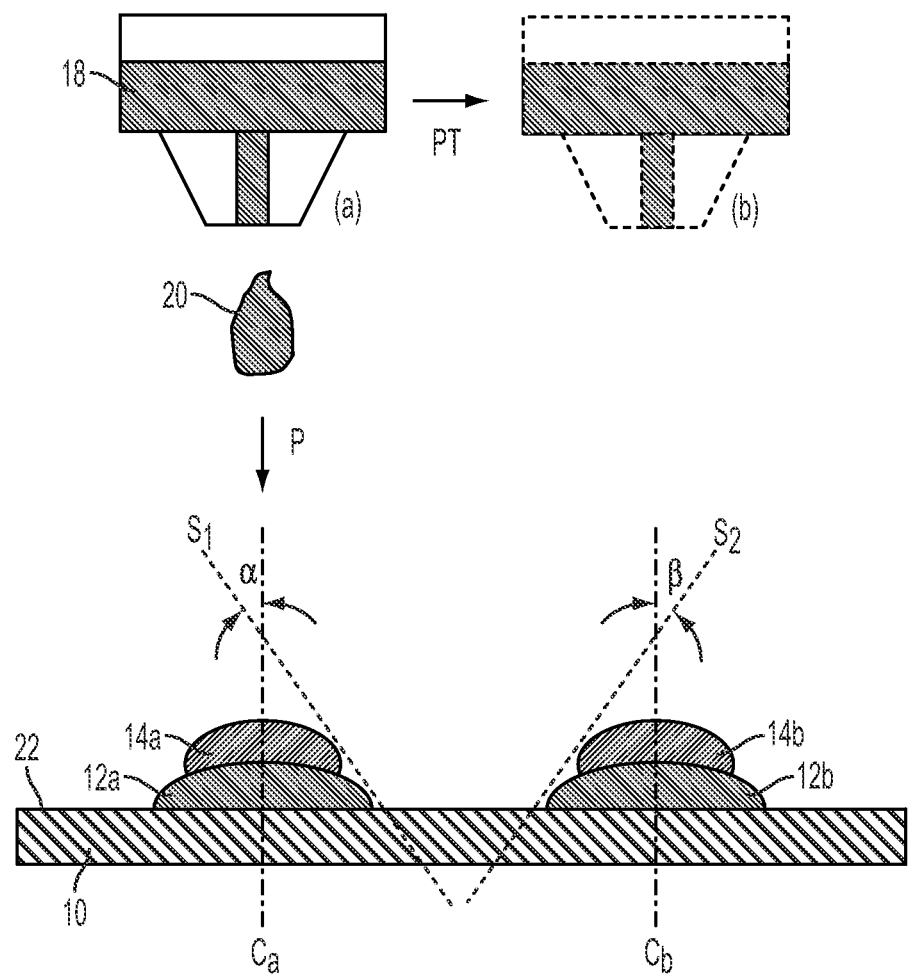

It is an end result of the feature formation processes described above that a print-patterned mask is formed. Once formed, the print-patterned mask may be used in a subsequent process, such as an electroplating process, in which conductive material is deposited in openings over said substrate formed by said mask. This is illustrated in FIG. 10, in which a material 100, such as copper, has been plated into opening 46 (illustrated in FIG. 5). Following the deposition of material 100, the print-patterned mask may be removed. According to one embodiment, the mask comprises a stearyl erucamide wax or similar material which may be removed by exposure to a heated solvent, the temperature of the solvent being above the melting temperature of the material forming the print-patterned structure.

As mentioned, opening 46 may be formed to have a high aspect ratio, as high as 70:1 in some embodiments, but preferably in the range of 3:1 to 10:1, allowing for the formation of high aspect ratio structures therein. This is true when the sidewalls of opening 46 are in a plane which is perpendicular to the plane of the substrate, as shown in FIG. 9A, as well as when the sidewalls of opening 46 are in a plane which is at a reentrant angle relative to a plane which is perpendicular to the plane of the substrate, as shown in FIG. 9B.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. For example, it has been assumed in the above description that the process used for the formation of the second (and subsequent) layer of features is the same as the process used for the formation of the first layer of features. However, aspects of the process may be controlled for desired results. By way of example, the feature dimension may be controlled by changing the print head waveform or by changing the temperature of operation to increase or decrease the cooling and solidification time. The gap between the print head and the substrate can be increased to control cooling time, etc. It will be appreciated, however, that any such change in process should not affect the registration of the print head from one layer to the next. Furthermore, the description above assumes that the print-patterned features are formed directly on the surface of a substrate. However, the substrate itself may have intermediate layers formed, patterned, and otherwise processed thereon or therein, for example to form electrical, optical, optoelectronic, electromechanical, and other types of components. In such a case, the print-patterned mask is formed over the substrate and aligned with such components, as appropriate, to permit electrical contact therewith.

Therefore, the foregoing detailed description provides those of ordinary skill in the art with a convenient guide for implementation of the invention, by way of examples, and contemplates that various changes in the functions and arrangements of the described embodiments may be made without departing from the spirit and scope of the invention defined by the claims thereto.

What is claimed is:
1. A method of producing a mask structure comprising the steps of:

positioning a print head in a first position such that a droplet of masking material ejected therefrom at said first position is directed toward a location over a surface of a substrate;

ejecting from said print head a first droplet of masking material which forms either in physical contact with said substrate or in physical contact with a layer formed over said substrate a first print-patterned feature, said first print-patterned feature spreading to a first lateral width over said surface of said substrate to thereby define a first lateral edge and a first centerline;

repositioning said print head to a second position such that a droplet of masking material ejected therefrom at said second position is directed toward a location over said first print-patterned feature; and ejecting from said print head a second droplet of masking material which forms exclusively over and in physical contact with a portion of said first print-patterned feature a second print-patterned feature, said second print-patterned feature spreading to a second lateral width over said first print-patterned feature to thereby define a second lateral edge and a second centerline, said first lateral width being greater than said second lateral width;

wherein the second position is such that the first lateral edge and the second lateral edge are aligned in a plane which is roughly perpendicular to a plane of said surface of said substrate and said first and second centerlines are not collinear.

2. The method of claim 1, wherein said masking material is a phase change material.

3. The method of claim 2, wherein said phase change material is a stearyl erucamide wax.

4. The method of claim 1, wherein said masking material is a polymer carried by a solvent solution.

5. The method of claim 1, further comprising the step of ejecting from said print head a third droplet of masking material which forms over and in physical contact with a portion of said second print-patterned feature a third print-patterned feature, said third print-patterned feature having a third lateral edge, wherein the first lateral edge, second lateral edge, and third lateral edge are aligned in a plane which is roughly perpendicular to a plane of said surface of said substrate.

6. The method of claim 1, further comprising the step of ejecting from said print head a third droplet of masking material which forms over a portion of said second print-patterned feature a third print-patterned feature, said third print-patterned feature having a third lateral edge, wherein the second lateral edge and third lateral edge are aligned in a plane which is inclined relative to a plane which is perpendicular to a plane of said surface of said substrate.

7. The method of claim 5, wherein said masking material forming said third print-patterned feature is a phase change material.

8. The method of claim 7, wherein said phase change material is a stearyl erucamide wax.

9. The method of claim 5, wherein said masking material forming said third print-patterned feature is a polymer carried by a solvent solution.

10. The method of claim 1, wherein said first and second features form feature stacks, and further comprising the steps of forming a plurality of such feature stacks in a multiple of locations over said surface of said substrate to form a print-patterned feature mask.

11. The method of claim 10, further comprising the step of depositing by electroplating a conductive material over said surface of said substrate except in locations of said print-patterned feature mask.

12. The method of claim 11, further comprising the step of removing said print-patterned feature mask by exposing same to a heated solvent, the temperature of the solvent being above the melting temperature of the material forming the print-patterned feature mask.

13. The method of claim 1, wherein said print head is an inkjet print head.

14. The method of claim 1, wherein said method produces a region in which no masking material is deposited, said region having a cross-section with an aspect ratio in the range of 3:1 to 10:1.

15. A method of forming electrical interconnections over a substrate comprising the steps of:
forming a print-patterned mask comprised of a plurality of print-pattern features and print-pattern feature stacks, each said print-pattern feature stack formed by the steps of:
positioning a print head in a first position such that a droplet of material ejected therefrom at said first position is directed toward a location over a surface of a substrate;

ejecting from said print head a first droplet of phase change material which forms over said surface of said substrate a first print-patterned feature, said first print-patterned feature spreading to a first lateral width over said surface of said substrate to thereby define a first lateral edge and a first centerline;

repositioning said print head to a second position such that a droplet of material ejected therefrom at said second position is directed toward a location over said first print-patterned feature; and ejecting from said print head a second droplet of phase change material which forms exclusively over a portion of said first print-patterned feature a second print-patterned feature, said second print-patterned feature spreading to a second lateral width over said first print-patterned feature to thereby define a second lateral edge and a second centerline, said first lateral width being greater than said second lateral width;

wherein the second position is such that the first lateral edge and the second lateral edge are aligned in a plane which is roughly perpendicular to a plane of said surface of said substrate and further wherein said first and second centerlines are not collinear; and with said print-patterned mask present, depositing a conductive material over said surface of said substrate except in locations of said print-patterned mask.

16. The method of claim 15, wherein said substrate has a layer deposited thereover, wherein said first and second print-patterned features are formed on a surface of said layer, and further wherein said step of depositing a conductive material comprises depositing said conductive material such that it is physical and electrical contact with said layer except in locations of said print-patterned mask.

17. The method of claim 15, wherein said phase change material is a stearyl erucamide wax.

18. The method of claim 15, wherein said conductive material is deposited by electroplating.

19. The method of claim 15, further comprising the step of removing said print-patterned mask by exposing said print-patterned structure to a heated solvent, the temperature of the solvent being above the melting temperature of the material forming the print-patterned structure.

20. The method of claim 15, wherein said print head is an inkjet print head.

21. The method of claim 15, wherein said method produces a region in which no masking material is deposited, said region having a cross-section with an aspect ratio in the range of 3:1 to 10:1.

22. The method of claim 15, further comprising, prior to the step of depositing said conductive material, the steps of:
- repositioning said print head from said second position to a third position such that a droplet of material ejected therefrom at said third position is directed toward a location over said second print-patterned feature; and
- ejecting from said print head a third droplet of phase change material which forms over a portion of said second print-patterned feature a third print-patterned feature, said third print-patterned feature having a third lateral edge;
- wherein the third position is such that the second lateral edge and the third lateral edge are aligned in a plane which is slightly reentrant relative to a plane which is perpendicular to a plane of said surface of said substrate.

23. The method of claim 22, wherein said method produces a region in which no masking material is deposited, said region having a cross-section with an aspect ratio in the range of 3:1 to 10:1.

* * * * *